United States Patent [19]

Kamata et al.

[11] 4,346,347

[45] Aug. 24, 1982

[54] DIODE FAULTS DETECTING APPARATUS

[75] Inventors: Shohichi Kamata; Yoshinori Kimura, both of Yokohama; Katsumi Hirai, Inagi, all of Japan

[73] Assignee: Tokyo Shibaura Denki Kabushiki Kaisha, Kawasaki, Japan

[21] Appl. No.: 97,494

[22] Filed: Nov. 26, 1979

[30] Foreign Application Priority Data

Dec. 15, 1978 [JP] Japan .................................. 53-154640
Dec. 15, 1978 [JP] Japan .................................. 53-154648

[51] Int. Cl.$^3$ ............................................. G01R 31/22
[52] U.S. Cl. .................................. 324/158 D; 340/645
[58] Field of Search ........... 324/158 D, 158 T, 158 R; 340/645

[56] References Cited

FOREIGN PATENT DOCUMENTS 494708 3/1976 U.S.S.R. ......................... 324/158 D

OTHER PUBLICATIONS

Hubner, et al.; "Uniform Turn-On . . . "; Ire Trans. on Electron Devices; Nov. 1961; pp. 461-464.
White, J. F.; "Semiconductor Control"; 1977; Artech House Inc., Dedham, Mass.; pp. 136, 137.

*Primary Examiner*—Ernest F. Karlsen
*Attorney, Agent, or Firm*—Cushman, Darby & Cushman

[57] ABSTRACT

First and second diodes are formed on the same semiconductor substrate. Both the diodes are forward biased by a direct current power supply. An attenuator is connected to a positive terminal of the first diode to produce an output lower in level than a voltage on the positive terminal of the first diode. A comparator receives the output of the attenuator as a first input and a voltage on a positive terminal of said second diode as a second input. When the first input is smaller than the second input, the comparator produces an output "0." When the first diode is open-circuited and the first input becomes greater than the second input, the comparator produces an output "1" and detects the fault of the first diode.

2 Claims, 6 Drawing Figures

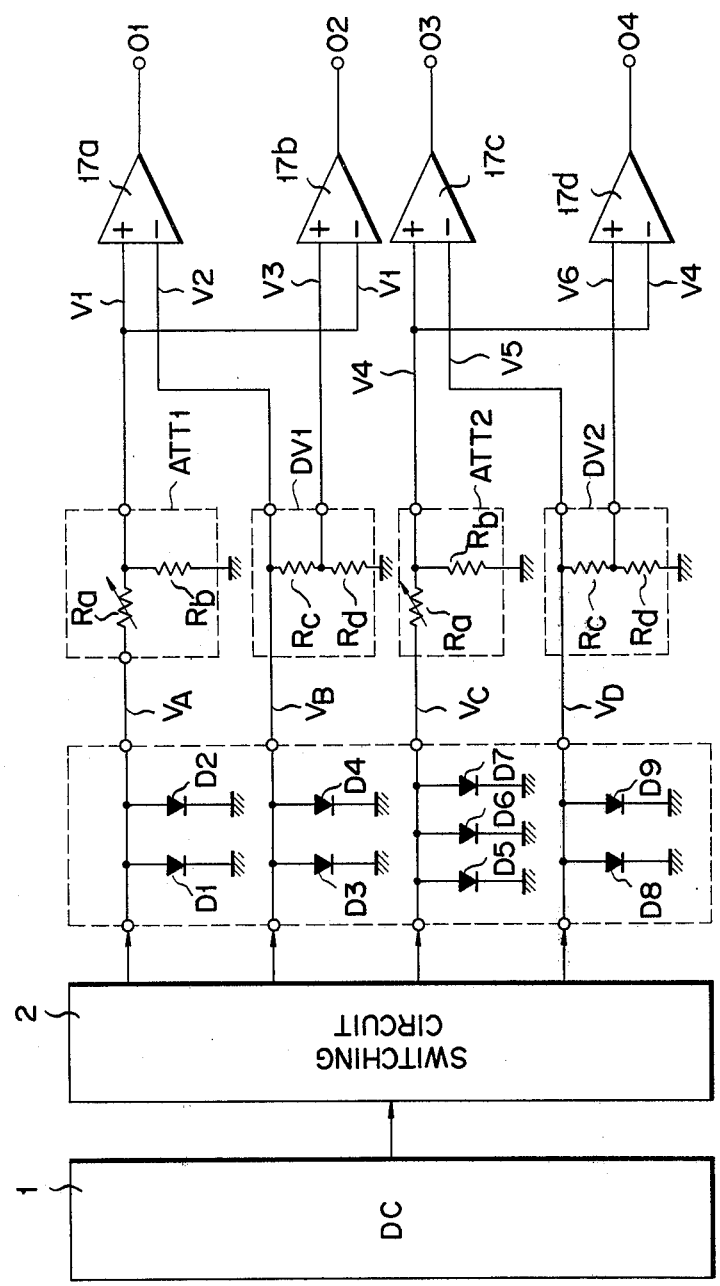
F I G. 5

DIODE FAULTS DETECTING APPARATUS

This invention relates to an apparatus for detecting faults of a plurality of diodes formed on the same substrate.

Semiconductor diodes are widely used, as rectifier or switching elements, in an electric communication field. Such diodes are often formed on the same substrate and each individual diode in a device as a whole performs an important function. If even one diode is faulty (for example, open-circuited or short-circuited), the device as a whole fails to attain the intended object. Furthermore faults detection has to be made without removing the diodes from the device, and the detection of the faulty diodes needs to be effected during a relatively short time period in which the device is not operated. For this reason, the faults detecting apparatus has to be simple in construction and the result of detection needs to be clearly displayed. Such faults detection method includes comparing a voltage drop of the diode with a reference voltage. Since in this method the voltage drop of the diodes to be detected varies prominently due to the ambient temperature, if for example one of a parallel array of diodes is open-circuited, it would be difficult to effect accurate detection.

Explanation will now be made by reference to FIGS. 1 and 2 so as to more understand the background of the invention.

FIG. 1 shows a phase shifters typical of those used in an electronic scanning antenna system. The electronic scanning antenna includes several hundreds of such unit phase shifters. The output of a DC power supply 1 is supplied to a voltage switching circuit (driver circuit) comprising switches 2a, 2b, 2c and 2d. The outputs of the respective switches are supplied respectively through strip lines 3 (shown with hatching lines to subunit phase shifters 4, 5, 6 and 7. The outputs of the switches 2a to 2d are supplied respectively through the strip lines 3 to the anodes of diodes of the subunit phase shifters 4 to 7 and the cathodes of the diodes are grounded. The mutually adjacent subunit phase shifters are coupled by a capacitor $C_1$ to each other. The subunit phase shifter 4 is coupled by a capacitor $C_2$ to a microwave signal input terminal 8 and the subunit phase shifter 7 is connected to an output terminal 9 to which the phase-controlled microwave signal is supplied through a capacitor $C_3$. The microwave signal on the output terminal 9 is delivered to an electromagnetic wave radiating element not shown. The above-mentioned diodes $D_1$ to $D_9$ are PIN diodes formed on the same substrate such as an alumina substrate. The subunit phase shifters 4, 5, 6 and 7 provide phase shifts of 22.5° ($\pi/8$ bit), 45° ($\pi/4$ bit), 90° ($\pi/2$ bit) and 180° ($\pi$ bit) to the input microwave signal from the input terminal 8. The subunit phase shifters 4, 5, 6 are called a loaded line type and the subunit phase shifter 7 "a hybrid type." By a combination of the phase shifts of the subunit phase shifters a phase shift of 0° to 337.5° can be obtained at an interval of 22.5°. The control of the phase shift is effected by switching a voltage applied to the diodes $D_1$ to $D_9$, in a forward direction or a reverse direction.

In actual practice, however, the forward or reverse switching of the diodes is effected by converting a TTL signal from an electronic scanning control computer to a drive voltage by means of a circuit (driver circuit) (not shown) and driving the diodes by the drive voltage. The drive voltage for a phase shift of "0" is, for example, 0.9 V (current through the diodes: 100 mA) and the drive voltage for a prescribed phase shift is $-20$ V (current through the diode: 0 mA). If in such an electronic scanning antenna system a diode or diodes are faulty, a beam pattern as obtained at the antenna system as well as the direction of the beam pattern varies, imparting radar information different from preset radar information. If such antenna system is incorporated into an aircraft microwave landing system, even one faulty diode could cause a grave consequence involving a loss of human life.

From this background description of this invention an attempt has been made to emphasize the desireability of preventing a fault of a microwave phase shifter resulting from a fault of a diode or diodes. Fault detecting apparatus requires a built-in-test-equipment (BITE system) for momentarily detecting the presence of faulty diodes, for example, between the operating times of the electronic scanning antenna system. As the diode faults detecting system satisfying such requirement there are (1) a system for measuring an insertion loss of a microwave input signal passing through the unit phase shifter, (2) a system for measuring a phase shift of the unit phase shifter, and (3) a system for measuring the terminal voltage of diodes constituting a unit phase shifter. The systems (1) and (2) are complicated in construction and difficult to put to practice. The system (3) is relatively easy.

FIG. 2 shows for example, a system such as system (3). In the system as shown in FIG. 2, however, it would be very difficult to sufficiently compensate for a variation of an inner voltage drop resulting from a temperature variation of the diode and, for this reason, the system can not be regarded as a practical apparatus. In the system (3) as shown in FIG. 2 a switch 2a includes a switching transistor 10 having its emitter connected to a 2 V terminal of a DC power supply 1, its collector connected to a $-15$ V terminal through resistors $R_1$ and $R_2$ and its base connected through a resistor $R_3$ to a terminal 11 to which a control signal from a scanning control electronic computer is inputted. The anodes of diodes $D_1$, $D_2$ in the subunit phase shifter 4 in FIG. 1 are connected to the collector of the transistor 10 through the resistor R1. The anode voltage of the diodes is represented by $V_d$. The anode voltage $V_d$ is supplied to one input terminal "+" of a comparator 12 and a reference voltage $V_r$ from a reference voltage supply 13 is supplied to the other input terminal of the comparator 12. An output "1" emerges on an output terminal 14 only when the voltage level on one input terminal "+" is greater than the voltage level on the other input terminal "−." The voltage $V_d$ is controlled by a control signal on the terminal 11 so as to be made 0.8 V when the diodes $D_1$, $D_2$ are forward-biased and $-15$ V when the diodes are reverse-biased.

Suppose that $V_r$ is set to 1.2 V and that the diodes $D_1$, $D_2$ are both in the normal and forward bias state. Since a relation $V_d < V_r$ is established the output on the terminal 14 is "0." With $D_1$, $D_2$ both in the open-circuited state, $V_d \approx 2$ V and thus a relation $V_d > V_r$ is established. As a result, an output on the terminal 14 is "1," showing that the diodes $D_1$, $D_2$ are both open-circuited.

Suppose that $V_r$ is set to $-1.5$ V and that a reverse bias is applied to the diode $D_1$, $D_2$. When the diodes $D_1$, $D_2$ are in the normal state, $V_d = -15$ V and a relation $V_d < V_r$ is established. The output on the terminal 14 is "0." If at this time at least one of the diodes $D_1$, $D_2$ is short-circuited, $V_d = 0$ V and thus a relation $0 > -1.5$ is established. The output level on the terminal 14 is "1," showing that at least one of the diodes $D_1$, $D_2$ is short-circuited.

When, as mentioned above, the diodes $D_1$, $D_2$ are both in the open-circuited state the output level on the terminal 14 is "1." At what level should $V_r$ be set with one (for example $D_1$) of the diodes $D_1$, $D_2$ in the open-circuited state and the other diode $D_2$ in the normal state? If in this case the forward current of one diode is 100 mA, the level of $V_d$ when the diode $D_1$ is in the open-circuited state is merely about 30 mV higher than when the diodes $D_1$, $D_2$ are both in the normal state. It will be evident, therefore, that in order to detect a voltage variation 30 mV of $V_d$ the level of $V_r$ has to be set to satisfy a relation $V_d < V_r < (V_d + 30 \text{ mV})$. In other words, unless $V_r$ is set to a level corresponding to $V_d + 30$ mV max. it is impossible to detect the open-circuited state of the diode $D_1$. The setting of $V_r$ is difficult, from a practical view point, taking into consideration the fact that the variation of $V_r$ and the level variation of $V_d$ resulting from a variation of the inner voltage drop of the diode per se by a temperature variation are great. This will be explained in more detail below. Suppose that the forward bias current of one diode is 100 mA and that the ambient temperature varies from $-10°$ C. to $+50°$ C. In this case, a variation in the level of $V_d$ resulting from temperature variation will reach about 100 mV. Therefore, the setting value of $V_r$ should be made responsive to the temperature variation. In order to do this, the level of $V_r$ needs to be varied such that it follows the temperature of the location at which diodes are attached. The temperature senser of diodes and the temperature control mechanism of the reference voltage source 13 are necessary and thus it is practically impossible to effect such a following operation.

It is accordingly the object of this invention to provide a diode faults detecting apparatus which, even if one of a parallel array of diodes is in the open-circuited state, can detect the fault of the diode without being influenced by the ambient temperature.

A diode faults detecting apparatus of this invention comprises a direct current power supply; at least first and second diodes to be detected, formed at the same substrate and connected in parallel with the direct current power supply; an attenuator connected to a first polarity terminal of the first diode to produce an output having a level lower than a voltage level on the first polarity terminal of the first diode; and a comparator for receiving the output of the attenuator as a first input and the voltage on the first polarity terminal of the second diode as a second input to produce a comparison output between the first input and the second input.

This invention can be more fully understood from the following detailed description when taken in conjunction with the accompanying drawings, in which:

FIG. 5 is a circuit diagram showing a diode faults detecting apparatus according to a third embodiment of this invention.

Figure 1:
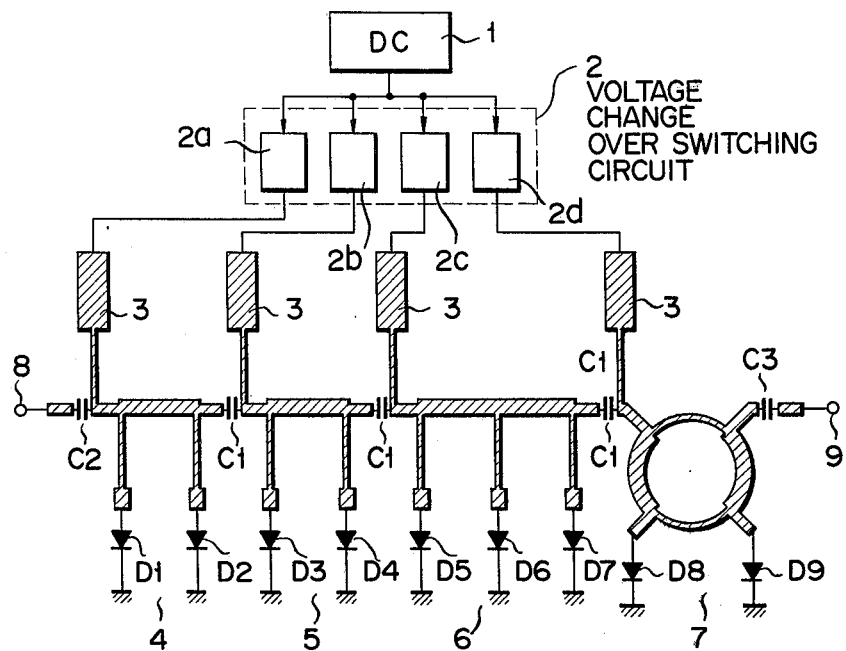
FIG. 1 is a circuit diagram showing an outline of a unit phase shifter of an electronic scanning antenna system.
Figure 3:
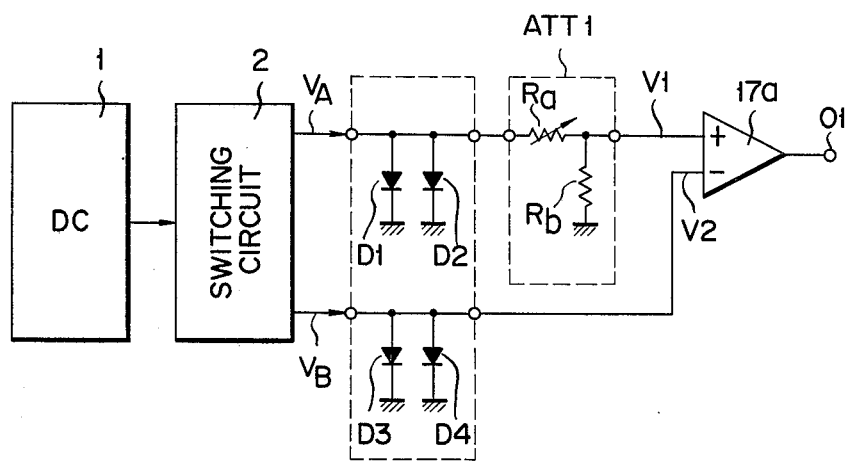
FIG. 3 is a circuit showing a diode faults detecting apparatus according to a first embodiment of this invention.

In a first embodiment of the invention as shown in FIG. 3 like reference numerals are employed to designate parts and elements corresponding to those shown in FIG. 1. A positive terminal of a power supply 1 is supposed to be connected to the anodes of diodes $D_1$ and $D_2$ through switching circuit 2 and therefore the terminal voltages of the diodes $D_1$, $D_2$ and $D_3$, $D_4$ are represented by $V_A$ and $V_B$, respectively. The terminal voltage $V_A$ of the diodes $D_1$ (first diode), $D_2$ is supplied to the input terminal of the attenuator ATT1 and the output voltage of the attenuator ATT1 is represented by $V_1$. The terminal voltage $V_B$ of the diodes $D_3$ (second diode), $D_4$ is represented by $V_2$. The voltage $V_1$ is supplied to one input terminal "+" of a comparator 17a and the voltage $V_2$ is supplied to the other input terminal "−." The comparator produces an output 01. It is assumed that at $V_1 < V_2$ the comparator produces an output "0" and that at $V_1 > V_2$ the comparator produces an output "1." If at this time at least one (for example, $D_1$) of the diodes $D_1$, $D_2$ is open-circuited and the diodes $D_3$, $D_4$ are in the normal state, $V_1$ is increased and a relation $V_1 > V_2$ is established. As a result, the comparator produces an output "1." It is therefore possible to detect the open-circuited state of either one, or both, of the diodes $D_1$ and $D_2$.

Figure 4:
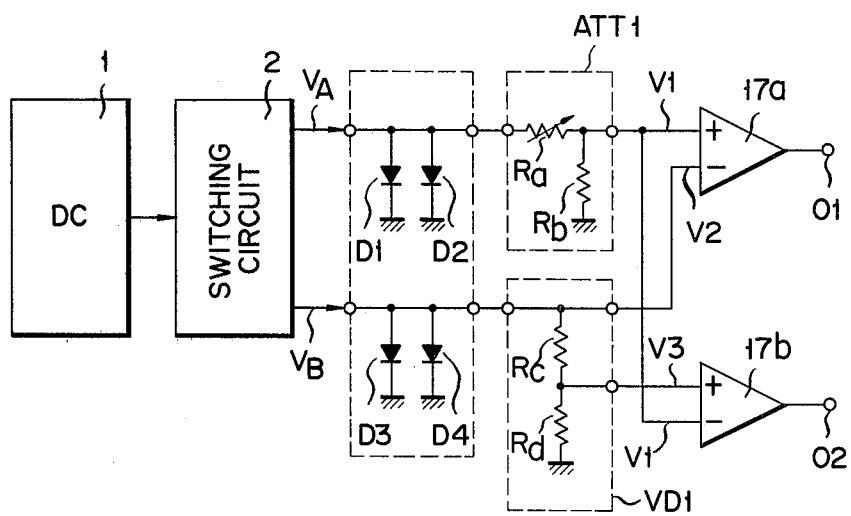
FIG. 4 is a circuit diagram showing a diode faults detecting apparatus according to a second embodiment of this invention.

In a second embodiment of the invention shown in FIG. 4 the positive terminal of a power supply 1 is supposed to be connected to the anode of diodes $D_1$, $D_2$ through the switching circuit 2 and the terminal voltages of diodes ($D_1$, $D_2$), ($D_3$, $D_4$) are represented by $V_A$ and $V_B$, respectively. The terminal voltage $V_A$ of the diodes $D_1$, $D_2$ is supplied to the input terminal of an attenuator ATT1. The output voltage of the attenuator ATT1 is represented by $V_1$. The terminal voltage $V_B$ of the diodes $D_3$, $D_4$ is supplied to the input terminal of a voltage divider $VD_1$. The voltage divider $VD_1$ produces a first output $V_2$ equal in level to, for example, $V_B$ and a second output $V_3$ lower in level than $V_2$. The voltage $V_1$ is supplied to one input terminal "+" of a first comparator 17a and the voltage $V_2$ is supplied to the other input terminal "−" of the first comparator 17a. The comparator 17a produces an output 01. A second output $V_3$ of the voltage divider $VD_1$ is supplied to one input terminal "+" of a second comparator 17b and the output $V_1$ of the attenuator ATT1 is supplied to the input terminal "−" of the second comparator 17b. The second comparator produces an output 02.

As shown in FIG. 4, the diodes $D_1$ to $D_4$ are forward biased. Suppose that the bias voltage is 0.8 V. In this case, $V_A$ and $V_B$ are 0.8 V. As evident from FIG. 4 a relation $V_2 > V_1 > V_3$ is established. If the diodes $D_1$ to $D_4$ are in the normal state, $V_1 < V_2$ and $V_3 < V_1$. Thus, $D_1$ and $D_2$ are "0." It is important to note that each comparator produces an output "0" when an input level on the input terminal "+" is smaller than an input level on the input terminal "−," and produces an output "1" when the input level on the input terminal "+" is greater than the input level on the input terminal "−."

Suppose that at least one (for example, $D_1$) of the diodes $D_1$, $D_2$ is in the open-circuited state and that the diodes $D_3$, $D_4$ are in the normal state. At this time, the voltage $V_A$ and thus the voltage $V_1$ are increased and a relation $V_1 > V_2$ is established. Thus, the output 01 of the comparator 17a is "1." Even if $V_1$ is increased, a relation $V_1 > V_3$ is held and thus the output 02 of the comparator 17b is held at "0." As a result, the output 01 of the comparator is "1," showing that at least one of the diodes $D_1$, $D_2$ is in the open-circuited state.

Next assume that at least one of the diodes $D_3$, $D_4$ is in the open-circuited state and that the diodes $D_1$, $D_2$ are in the normal state. At this time, $V_B$, $V_2$ and $V_3$ are increased, but $V_1$ is constant. Since in the comparator 17a a relation $V_1 < V_2$ remains unchanged, the output 01 is "0." In the comparator 17b, $V_3$ is increased and $V_1$ is constant. As result, a relation $V_3 > V_1$ is established and the output 02 is "1," showing that at least one of the diodes $D_3$, $D_4$ is in the open-circuited state.

Suppose that at least one of the diodes $D_1$, $D_2$ is short-circuit. At this time, $V_A$ and $V_1$ becomes 0 V. In the comparator 17a, a relation $V_1 < V_2$ is constant and the output 01 is held at the "0" level. In the comparator 17b, a relation $V_3 > V_1$ is established and the output 02 becomes "1," showing that at least one of the diodes $D_1$, $D_2$ is short-circuited.

Let it be assumed that at least one of the diodes $D_3$ and $D_4$ is short-circuited. At this time, $V_B$, $V_2$ and $V_3$ are in the "0" level and $V_A$, $V_1$ are constant. In the comparator 17b a relation $V_3 < V_1$ is constant and the output 02 is "0." In the comparator 17a, on the other hand, a relation $V_1 > V_3$ is established and the output 01 becomes "1," showing that at least one of the diodes $D_3$, $D_4$ is short-circuited.

From the combinations of the outputs of the comparators it will be understood that when the outputs of the comparators are all at the "0" level the diodes $D_1$ to $D_4$ are all in the normal state and when the output of either one of the comparators 17a, 17b becomes "1" at least one of the diodes $D_1$ to $D_4$ is faulty.

If consideration is given only to the apparatus of FIG. 1 it is unnecessary to detect which faulty mode exists in which diode or diodes. It is only necessary to detect the pressure of a faulty one of diodes constituting the subunit phase shifters.

Figure 2:
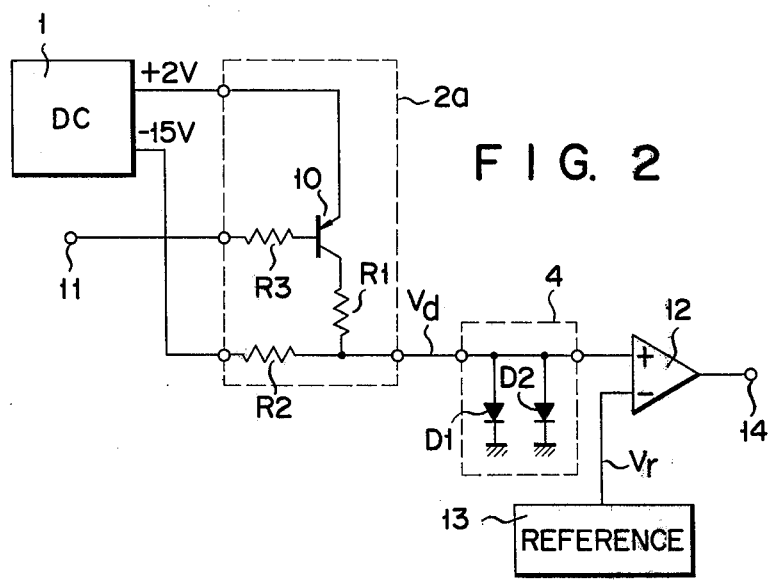
FIG. 2 is a circuit diagram showing one example of a diode faults detecting apparatus for explaining the background of this invention.

In the embodiment shown in FIG. 4 the diodes $D_1$, $D_2$ and $D_3$, $D_4$ are PIN diodes of the same construction as formed on the same substrate. The terminal voltages $V_A$, $V_B$ vary in the same direction dependent upon the ambient temperature. Since the relative value of the voltages $V_1$, $V_2$ is not influenced by a variation in the ambient temperature a level difference of $V_1$, $V_2$ and $V_3$ can be set very smaller. In other words, the problem of the FIG. 2 apparatus can be solved completely. If, therefore, the attenuator ATT1 and voltage divider VD1 are set such that a level difference $\Delta V = V_2 - V_1 = V_1 - V_3$ is 15 mV, even about 30 mV variation of the terminal voltage $V_d$ when, for example, only the diode $D_1$ is in the open-circuit state can be accurately detected.

In the apparatus of this invention a bias voltage can be supplied through the above-mentioned driver circuit to the diodes $D_1$, $D_2$ or $D_3$, $D_4$. It is possible to detect even the abnormal state of the terminal voltage of the diode as resulting from the fault of the driver circuit.

In the embodiment shown in FIG. 4, if the group of diodes $D_1$, $D_2$ and group of diodes $D_3$, $D_4$ suffer the same mode of fault, it is impossible to effect faults detection. It is rare, however, that both the diode groups experience the same faulty mode. Even if the same faulty mode occurs in both the diode groups, faults detection can be effected by an apparatus of FIG. 6 which constitutes a modification of this invention.

As already explained in FIG. 1 the unit phase shifter includes the subunit phase shifters 4, 5, 6 and 7 and it is convenient to construct the apparatus as shown in FIG. 5. In FIG. 5, the anode terminals (voltage $V_C$) of diodes $D_5$ (third diode), $D_6$ and $D_7$ are connected to the positive terminal of a power supply 1 the switching circuit 2 and to the input terminal of a second attenuator ATT2 of the same construction as that of the attenuator ATT1. The attenuator ATT2 produces an output V4. The anode terminals (voltage $V_D$) of diodes $D_8$ (fourth diode), $D_9$ are connected to the positive terminal of the power supply through the switching circuit 2 and to a second voltage divider VD2. The voltage divider VD2 produces a first output $V_5$ equal in level to, for example, the voltage $V_D$ and a second output $V_6$ lower in level than $V_5$. A third comparator 17c receives an output V4 of the second attenuator ATT2 at the input terminal "+" thereof and a first output $V_5$ of a second voltage divider VD2 at the input terminal "−" thereof to produce an output 03. A fourth comparator 17d receives a second output $V_6$ of a second voltage divider VD2 at the input terminal "+" thereof and an output V4 of a second attenuator ATT2 at the input terminal "−." In exactly the same way as explained in connection with FIG. 4, if faults occur in the group of diodes $D_5$, $D_6$, $D_7$ or the diode group of diodes $D_8$, $D_9$, faults detection can be made by a combination of the outputs 03, 04 of the comparators 17c, 17d.

Figure 6:
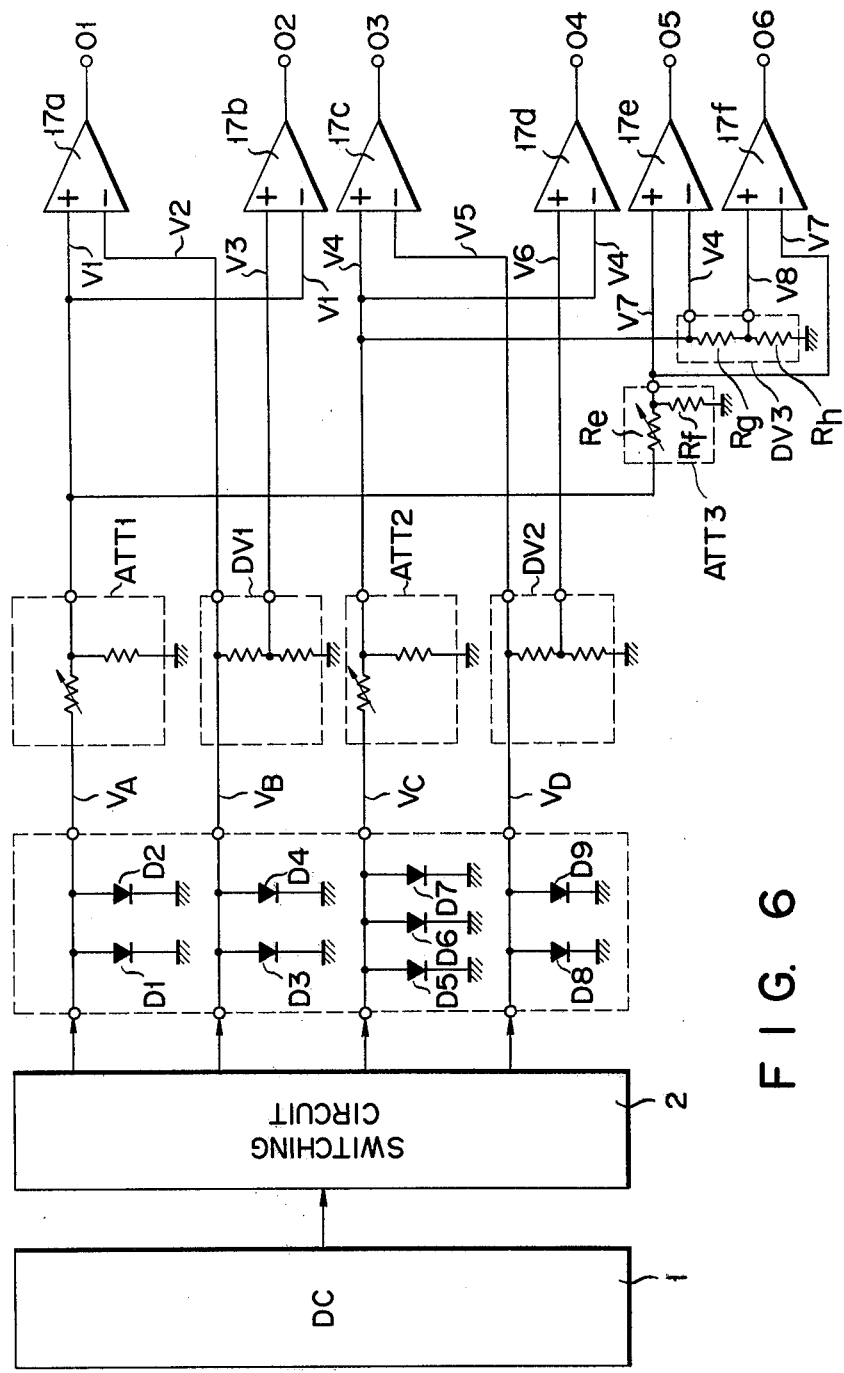
FIG. 6 is a circuit diagram showing a diode faults detecting apparatus according to a fourth embodiment of this invention.

An embodiment as shown in FIG. 6 is the same as the embodiment of FIG. 5 except for the addition of a third attenuator ATT3 including resistors Re, Rf, a third voltage divider VD3 including resistors Rg, Rh, a fifth comparator 17e (output 05) and a sixth comparator 17f (output 06). An output $V_1$ of a first attenuator ATT1 is supplied to the third attenuator ATT3 and an output V4 of a second attenuator ATT2 is supplied to the third voltage divider VD3. The fifth comparator 17e receives an output $V_7$ of the third attenuator ATT3 at the input terminal "+" thereof and a first output V4 of the third voltage divider VD3 at the input terminal "−." The sixth comparator 17f receives a second output $V_8$ of the third voltage divider VD3 at the input terminal "+" thereof and an output $V_7$ of the third attenuator ATT3 at the input terminal "−."

Suppose that at least one of diodes $D_1$, $D_2$ and at least one of diodes $D_3$, $D_4$ are in the open-circuited state and that these faults are not detected in the comparators 17a, 17b. Suppose also that diodes $D_5$, $D_6$ and $D_7$ are in the normal state. At this time, a voltage $V_7$ exceeds a set value and a voltage V4 is held at the set value. In the comparator 17e, a relation $V_7 > V_4$ is established and an output 05 becomes "1." In the comparator 17f, $V_7$ is increased and $V_8$ is held at the setting value and the relation $V_8 > V_7$ is maintained. Therefore, an output 06 is held at the "0" level. Even if faults such as open-circuiting occur in the diode groups ($D_1$, $D_2$) and ($D_3$, $D_4$), faults detection can be made because an output 05 equals "1."

Suppose that at least one of diodes $D_1$, $D_2$ and at least one of diodes $D_3$, $D_4$ are in the short-circuited state. In this case, in the comparator 17e an input voltage $V_7$ becomes 0 V and an input voltage V4 remains to be a set value. Since a relation $V_7 < V_4$ is held, an output 05 is held at the "0" level. In the comparator 17f, an input voltage $V_7$ becomes 0 V and an input voltage $V_8$ is held at a set value. Thus, a relation $V_8 > V_7$ is established and an output 06 becomes "1." Even if the same fault mode such as short-circuiting occurs in the diodes $D_1$, $D_2$ and $D_3$, $D_4$, faults detecting can be effected because the output 06 becomes "1."

It is highly unlikely that all the diodes constituting subunit phase shifters 4, 5, 6, 7 suffer the same faults mode. According to this invention, therefore, the faults detection of diodes constituting an electronic scanning antenna system can be adequately effected, fully attaining an intended object. Although in the embodiments of FIGS. 3 to 6 the diodes are arranged adjacent each other, this invention is not restricted to this arrangement. As shown in each embodiment the diodes to be tested are not restricted only to the diodes constituting diode phase shifters.

What we claim is:

1. Apparatus for fault testing at least two diodes without using a reference diode, comprising:
   a direct current power supply;
   at least first and second diodes to be fault detected, formed on the same substrate;
   means for independently biasing said first and second diodes with power from said direct current power supply;
   an attenuator, connected to a first polarity terminal of said first diode, to produce an attenuator output voltage having a level lower than a voltage level on said first polarity terminal of said first diode; and
   a comparator having a first input coupled to the output of said attenuator and a second input coupled to a first polarity terminal of said second diode, to produce a logic level comparison output signal indicating whether or not the attenuator output voltage is higher than that of the first polarity terminal of the second diode, thereby indicating whether one of said diodes is faulty.

2. A diode faults detecting apparatus according to claim 1 further comprising at least one additional diode connected in parallel with each of said first and second diodes.

* * * * *